(12) United States Patent
Kim

(10) Patent No.: US 9,633,944 B2
(45) Date of Patent: Apr. 25, 2017

(54) SEMICONDUCTOR DEVICE AND MANUFACTURING METHOD THEREOF

(71) Applicant: SK hynix Inc., Gyeonggi-do (KR)

(72) Inventor: Hae Soo Kim, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/850,355

(22) Filed: Sep. 10, 2015

(65) Prior Publication Data
US 2016/0322297 A1    Nov. 3, 2016

(30) Foreign Application Priority Data

Apr. 28, 2015 (KR) ........................ 10-2015-0059978

(51) Int. Cl.
| | |
|---|---|
| H01L 23/00 | (2006.01) |
| *H01L 23/528* | (2006.01) |
| *H01L 23/522* | (2006.01) |
| *H01L 23/535* | (2006.01) |
| *H01L 21/768* | (2006.01) |
| H01L 27/11548 | (2017.01) |
| H01L 27/11556 | (2017.01) |
| H01L 27/11575 | (2017.01) |
| H01L 27/11582 | (2017.01) |

(52) U.S. Cl.
CPC ...... *H01L 23/528* (2013.01); *H01L 21/76816* (2013.01); *H01L 21/76877* (2013.01); *H01L 21/76895* (2013.01); *H01L 23/5226* (2013.01); *H01L 23/535* (2013.01); *H01L 27/11548* (2013.01); *H01L 27/11556* (2013.01); *H01L 27/11575* (2013.01); *H01L 27/11582* (2013.01)

(58) Field of Classification Search
CPC ..................................................... H01L 23/528
See application file for complete search history.

(56) References Cited

U.S. PATENT DOCUMENTS

| | | | |
|---|---|---|---|
| 2009/0230449 A1* | 9/2009 | Sakaguchi | .......... H01L 27/0688 257/298 |
| 2015/0206895 A1* | 7/2015 | Oh | ........................ H01L 23/528 257/324 |

FOREIGN PATENT DOCUMENTS

| | | |
|---|---|---|
| KR | 1020130022197 | 3/2013 |
| KR | 101250851 | 4/2013 |

* cited by examiner

*Primary Examiner* — William Harriston
(74) *Attorney, Agent, or Firm* — IP & T Group LLP

(57) ABSTRACT

A semiconductor device and a manufacturing method thereof are provided. A semiconductor device includes a stack structure including conductive layers stacked in a step shape, a first interlayer insulating layer formed over the stack structure, the first interlayer insulating layer including contact holes with a uniform depth, which expose the conductive layers, lower contact plugs formed in the contact holes, the lower contact plugs being respectively contacted with the conductive layers, and lower contact pads respectively connected to the contact plugs.

19 Claims, 10 Drawing Sheets

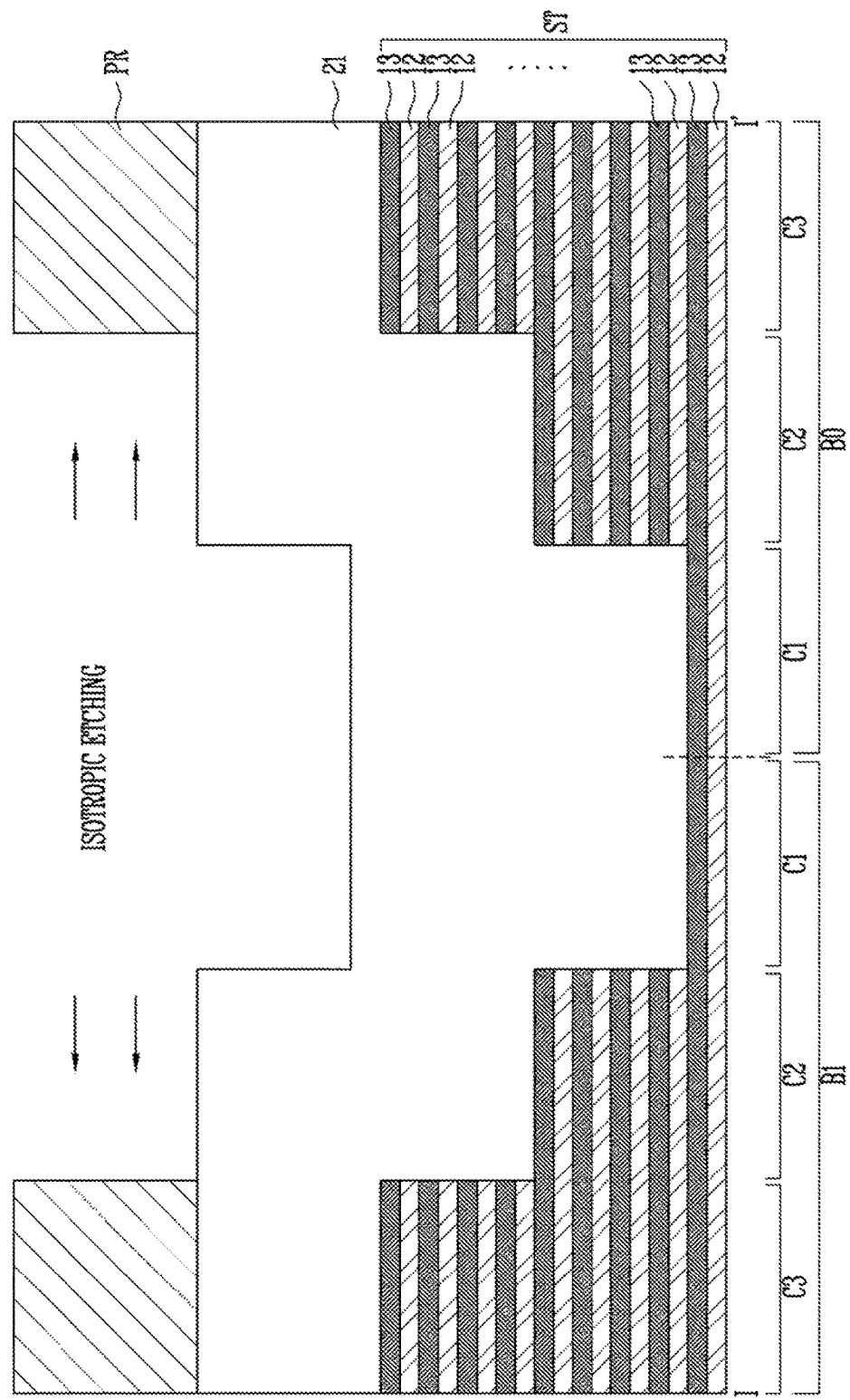

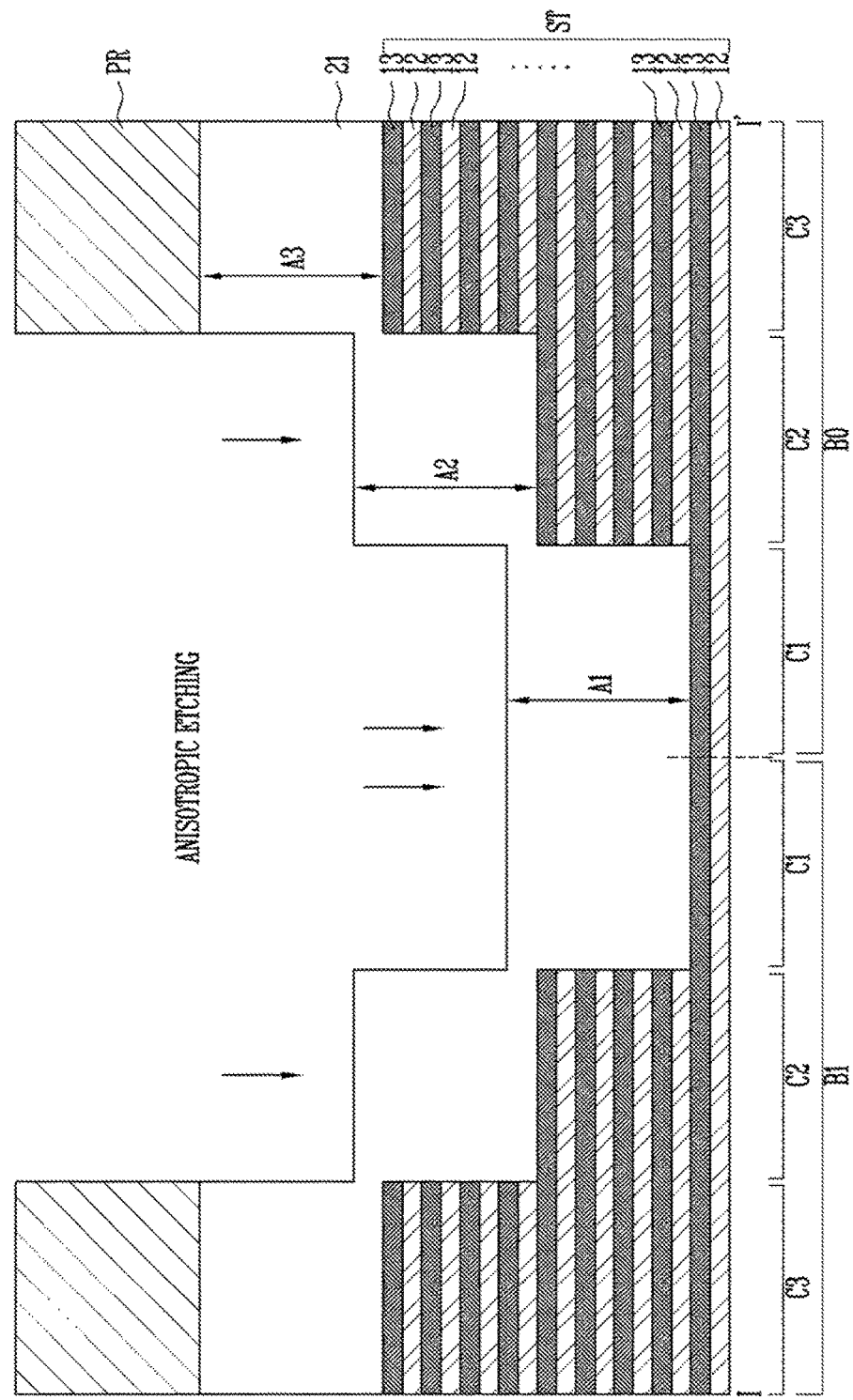

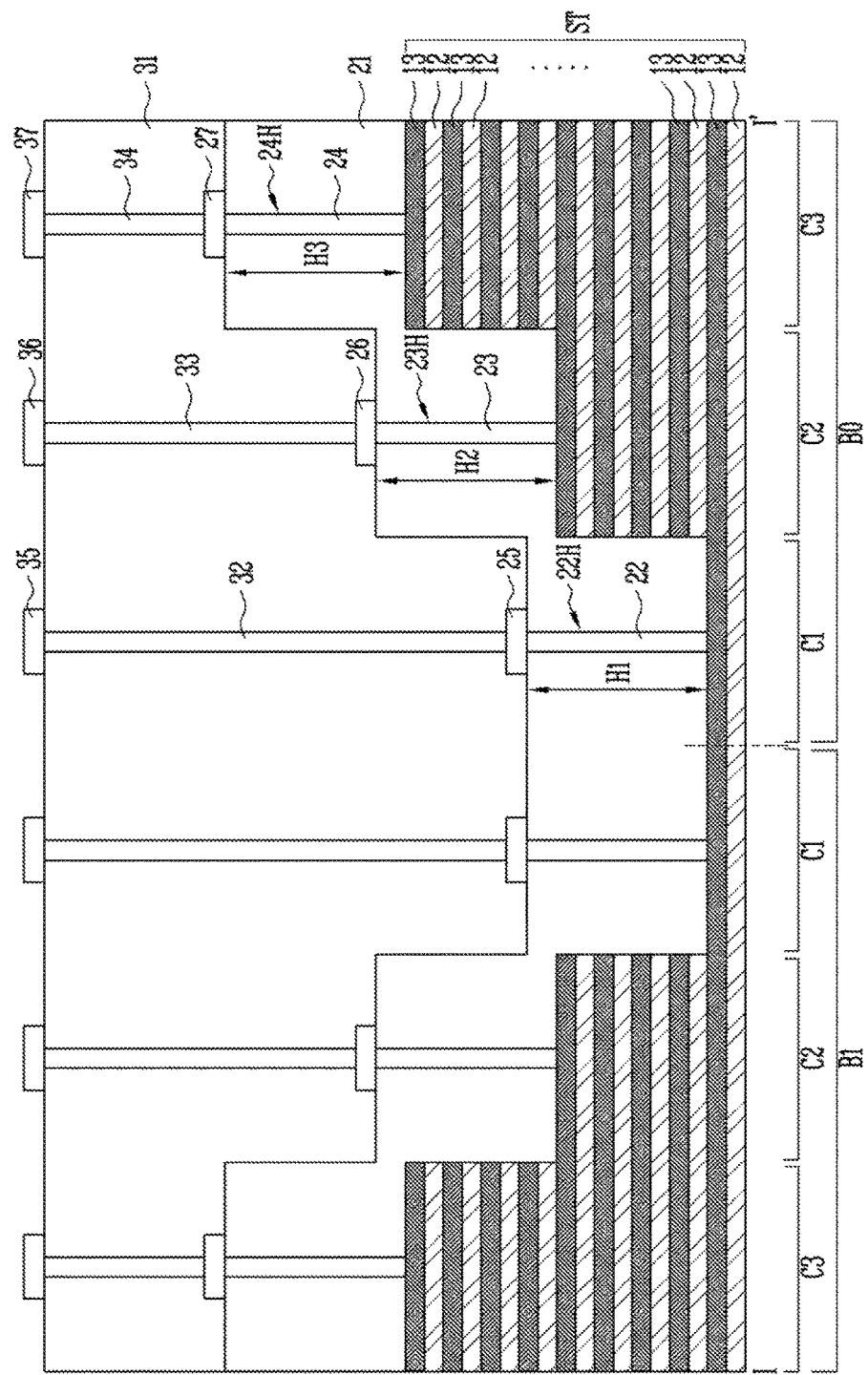

SEMICONDUCTOR DEVICE AND MANUFACTURING METHOD THEREOF

CROSS-REFERENCE TO RELATED APPLICATION

The present application claims priority to Korean patent application number 10-2015-0059978, filed on Apr. 28, 2015, the entire disclosure of which is herein incorporated by reference in its entirety.

BACKGROUND

1. Field

An aspect of the present invention relates to a semiconductor device and a manufacturing method thereof, and more particularly, to a semiconductor device having a three-dimensional structure and a manufacturing method thereof.

2. Discussion of Related Art

A nonvolatile memory device is a memory device in which stored data are maintained when a power supply is interrupted. As integration of a two-dimensional memory device in which memory cells are formed in a single layer on a silicon substrate reaches its limits, there has recently been proposed a three-dimensional nonvolatile memory device in which memory cells are vertically stacked on a silicon substrate.

The three-dimensional nonvolatile memory device includes interlayer insulating layers and word lines, which are alternately stacked, and channel layers penetrating the interlayer insulating layers and the word lines. Memory cells are stacked along the channel layers. Contact plugs are respectively connected to the stacked word lines, thereby selectively driving desired memory cells.

However, to implement such a structure, contact plugs having various depths should be formed which results in using a complicated manufacturing process. For example, in a process of forming a contact plug, it is difficult to adjust the depth of a contact hole due to a step difference of an Interlayer insulating layer. Therefore, the contact plug may penetrate a word line, thereby causing a bridge. Alternatively, the contact plug may not reach the word line, and therefore, a process defect may occur.

SUMMARY

Embodiments provide a semiconductor device and a manufacturing method thereof, which can reduce the occurrence of defects when contact plugs of the semiconductor device are formed.

According to an aspect of the present invention, there is provided a semiconductor device including: a stack structure having conductive layers, wherein the conductive layer are stacked in a step shape; a first interlayer insulating layer formed over the stack structure, wherein the first interlayer insulating layer includes contact holes, wherein the contact holes have a uniform depth and expose the conductive layers; lower contact plugs formed in the contact holes, wherein the lower contact plugs are respectively in contact with the conductive layers; and lower contact pads respectively connected to the lower contact plugs.

According to an aspect of the present invention, there is provided a semiconductor device including: a stack structure including conductive layers, wherein the conductive layers are stacked in a step shape; a first interlayer insulating layer formed over the stack structure, wherein the first interlayer insulating layer includes contact holes, wherein the contact holes have a uniform depth and respectively expose the conductive layers; lower contact plugs respectively formed in the contact holes, wherein the lower contact plugs are respectively contacted with the conductive layers; lower contact pads respectively connected to the contact plugs, the lower contact pads being arranged at different levels from each other; upper contact plugs respectively connected to the lower contact pads; and upper contact pads respectively connected to the upper contact plugs, wherein the upper contact pads are arranged at the same level.

According to an aspect of the present invention, there is provided a method of manufacturing a semiconductor device, the method including: forming a stack structure including insulating layers and sacrificial layers and having a step shape, wherein the insulating layers and the sacrificial layer are alternately stacked; forming a first interlayer insulating layer over the stack structure; removing the sacrificial layers to create spaces; forming conductive layers in the spaces formed by removing the sacrificial layers; etching the first interlayer insulating layer such that the first interlayer insulating layer has a uniform thickness over the stack structure in the step shape; forming first contact holes having a uniform depth and respectively exposing the conductive layers of the stack structure by etching the first interlayer insulating layer; and forming lower contact plugs by filling the contact holes with a conductive material, respectively According to embodiments of the present invention, an interlayer insulating layer is formed on conductive layers and insulating layers which are alternately stacked in a step shape, and the lengths of contact plugs connected to the conductive layers by penetrating a subsequent interlayer insulating layer are formed to be uniform by patterning the interlayer insulating layer in a step shape. Thus, it is possible to prevent a contact bridge phenomenon and a contact failure between the contact plug and the conductive layer.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

FIGS. 3A to 3F are perspective and sectional views illustrating a manufacturing method of the semiconductor device shown in FIGS. 1 and 2.

DETAILED DESCRIPTION

In the following detailed description, only certain exemplary embodiments of the present invention have been shown and described by way of illustration. As those skilled in the art would realize, the described embodiments may be modified in various different ways, all without departing from the spirit or scope of the present invention. Accordingly, the drawings and description are to be regarded as illustrative in nature and not restrictive.

In the entire specification, when an element is referred to as being "connected" or "coupled" to another element, it can be directly connected or coupled to another element or be indirectly connected or coupled to another element with one or more intervening elements interposed therebetween. In addition, when an element is referred to as "including" a component, this indicates that the element may further include another component instead of excluding another component unless there is a different disclosure.

Figure 1:
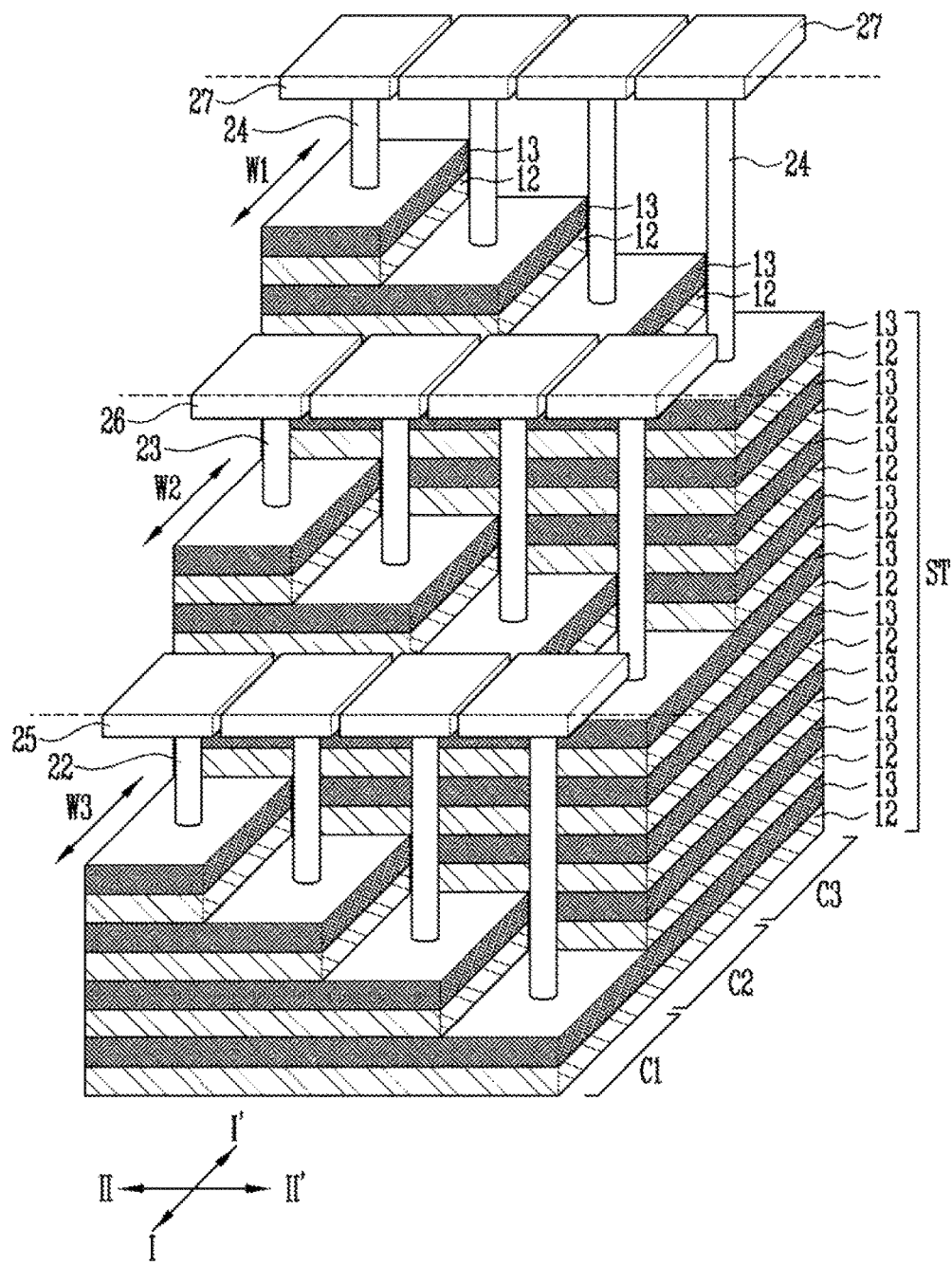
FIG. 1 is a perspective view illustrating a semiconductor device according to an embodiment of the present invention.
Figure 2:
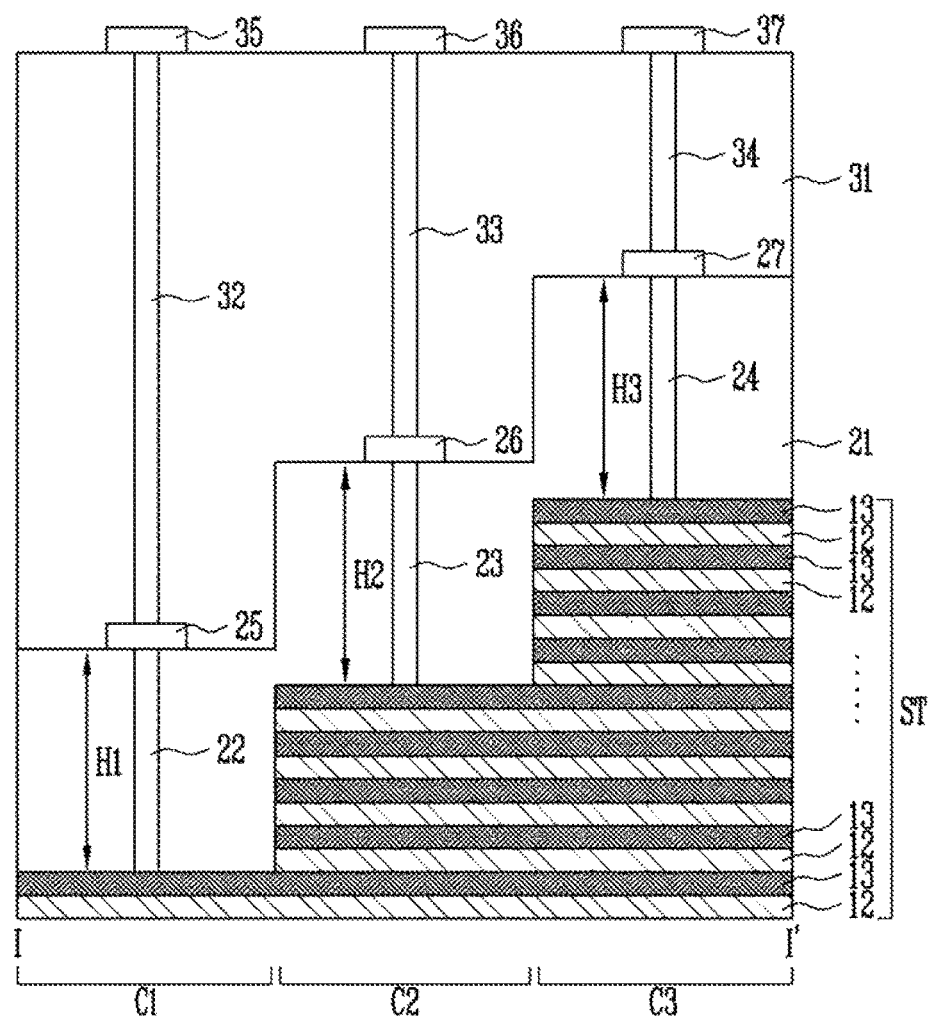
FIG. 2 is a sectional view illustrating the semiconductor device according to the embodiment of the present invention.

FIG. 1 is a perspective view illustrating a semiconductor device according to an embodiment of the present invention. FIG. 2 is a sectional view taken in a first direction (I-I') shown in FIG. 1.

Referring to FIGS. 1 and 2, the semiconductor device according to the embodiment of the present invention includes a plurality of connecting structures C1 to C3, a plurality of lower contact plugs 22, 23, and 24, a plurality of lower contact pads 25, 26, and 27, a plurality of upper contact plugs 32, 33, and 34, and a plurality of upper contact pads 35, 36, and 37. The connecting structures C1 to C3 are connecting word lines of a memory cell array to a peripheral circuit. Each of the word lines of the memory cell array has a vertical channel structure and horizontally extends to the peripheral circuit. For example, the connecting structures C1 to C3 may be connecting portions for connecting the word lines of the memory cell array to an X decoder.

The plurality of connecting structures C1 to C3 include insulating layers 12 and conductive layers 13, which are alternately stacked as steps.

Here, the conductive layers 13 are connected to the word lines of the memory cell array and may include polysilicon, tungsten, etc. which serve as a pad portion (not shown) for transmitting a bias voltage to each of the word lines. The insulating layers 12 insulate the stacked conductive layers 13 from each other and may include oxide, etc.

The plurality of connecting structures C1 to C3 may be included in the semiconductor device. The connecting structures C1 to C3 may be arranged in parallel to each other and in a first direction (I-I'). Also, slits (not shown) may be disposed between the adjacent connecting structures C1 to C3, and a slit insulating layer (not shown) may be disposed in the slit.

The connecting structures C1 to C3 may have different heights or lengths from each other. For example, a first connecting structure C1 includes first to nth insulating layers 12 and first to nth conductive layers 13, where, n is an Integer. A second connecting structure C2 includes first to 2nth insulating layers 12 and first to 2n conductive layers 13. A third connecting structure C3 includes first to 3nth insulating layers 12 and first to 3nth conductive layers 13.

Here, the first connecting structure may have a step shape. In the second connecting structure C2, the upper nth to 2nth insulating layers 12 and the upper nth to 2nth conductive layers 13 may have a step shape, and the lower first to nth insulating layers 12 and the lower first to nth conductive layers 13 may have a non-step shape. In the third connecting structure C3, the upper 2nth to 3nth insulating layers 12 and the upper 2nth to 3nth conductive layer 13 may have a step shape, and the lower first to 2nth insulating layers 12 and the lower first to 2nth conductive layers 13 may have a non-step shape. According to the structure described above, first to 3nth layered pad portions connected to the lower contact plugs 22, 23, and 24 may be distributed and disposed in the three connecting structures C1 to C3, respectively. Thus, it is possible to decrease the area of the connecting structures, as compared with a conventional structure when the first to 3nth layered pad portions are entirely disposed in one connecting structure.

The plurality of lower contact plugs 22, 23, and 24 are connected to pad portions of the plurality of connecting structures C1 to C3, respectively. The plurality of lower contact plugs 22, 23, and 24 are respectively connected to the conductive layers 13 of the plurality of connecting structures C1 to C3 by penetrating a first interlayer insulating layer 21 formed over the plurality of connecting structures C1 to C3. The lower contact plugs 22, 23, and 24, which are arranged along the line I-I' and connected to different connecting structures, may be formed such that their lengths H1, H2, and H3 are equal to one another.

The plurality of lower contact pads 25, 26, and 27 are formed over the plurality of lower contact plugs 22, 23, and 24, respectively. Lower contact pads disposed on the same connecting structure are preferably formed on the same height line, that is, extend up to the same level. The contact plugs 22, which are arranged in a second direction (II-II') and connected to the same connecting structure, may extend up to the same level. Also, a plurality of lower contact pads disposed on different connecting structures are formed on different height lines or different levels from each other.

The plurality of upper contact plugs 32, 33, and 34 are connected to the plurality of lower contact pads 25, 26, and 27, respectively. The plurality of upper contact plugs 32, 33, and 34 are respectively connected to the plurality of lower contact pads 25, 26, and 27 by penetrating a second interlayer insulating layer 31 formed on the first interlayer insulating layer 21. The plurality of upper contact pads 35, 36, and 37 are formed over the plurality of upper contact plugs 32, 33, and 34, respectively, and may be formed at the same height line or at the same level.

FIGS. 3A to 3F are perspective and sectional views illustrating a manufacturing method of the semiconductor device shown in FIGS. 1 and 2.

Figure 3A:
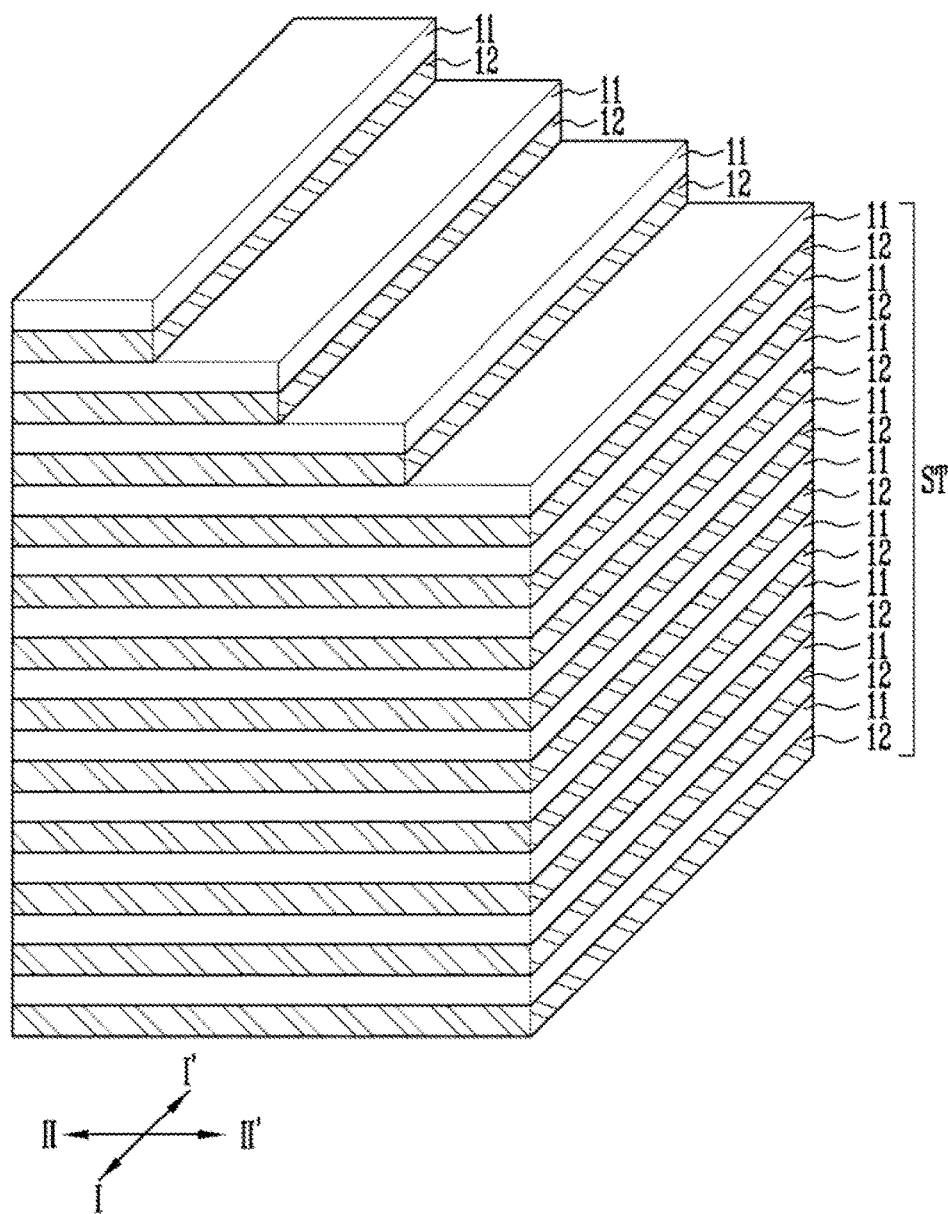

Referring to FIG. 3A, a stack structure ST is formed, including insulating layers 12 and sacrificial layers 11, which are alternately stacked. Here, the sacrificial layers 11 are replaced with conductive layers in a subsequent process. The sacrificial layers 11 are formed of a material having a high etching selectivity with respect to the insulating layers 12. For example, the sacrificial layers 11 include nitride, etc., and the insulating layers 12 include oxide, etc.

Subsequently, a mask pattern (not shown) is formed over the stack structure ST, and an etching process is then repeatedly performed. Accordingly, upper layers of the stack structure ST may form steps. The steps are formed in the second direction II-II'. In this case, the stack structure ST may be patterned such that a pair of the insulating layer 12 and the sacrificial layer 11 constitutes a single step.

Figure 3B:
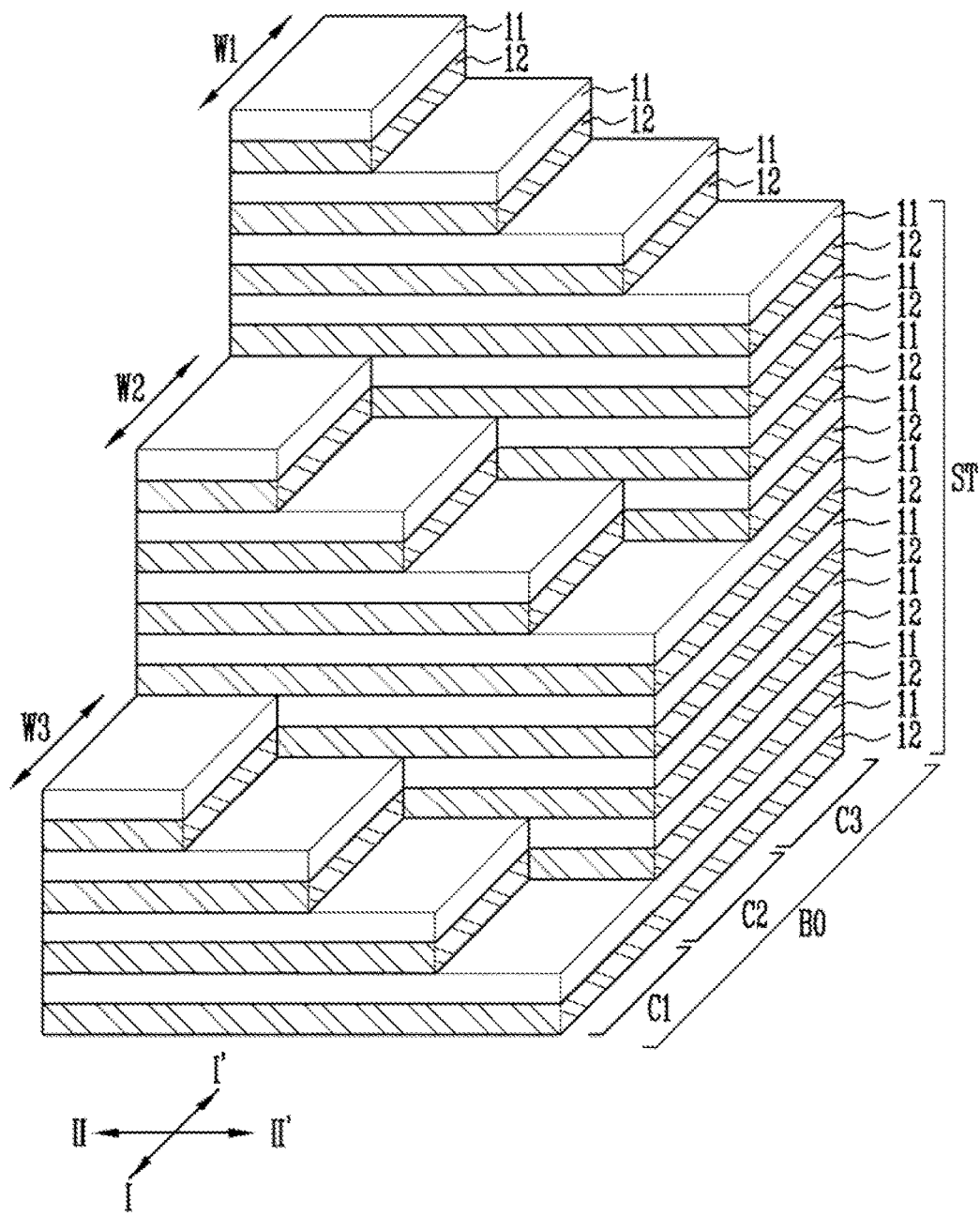

Referring to FIG. 3B, another mask pattern (not shown) is formed over the stack structure ST, and an etching process is then repeatedly performed to form steps in the first direction I-I'. In this case, the stack structure ST may be patterned such that N number of insulating layers 12 and N number of sacrificial layers 11 constitute a single step. For example, N is a natural number, and may be 4. Accordingly, the stack structure ST has step shapes in the first direction (I-I') and the second direction (II-II'). The first to third connecting structures C1 to C3 are included in one memory block B0 and are defined in the stack structure ST.

In this case, the widths W1 to W3 of the first to third connecting structures C1 to C3 are determined according to a degree of reduction of the mask pattern. The first to third connecting structures C1 to C3 may have the same width, that is, W1=W2=W3. In another embodiment, the first to third connecting structures C1 to C3 may have different widths from each other, for example, W1>W2>W3 or W1<W2<W3.

Although not shown in this figure, after the step of forming the first to third connecting structures C1 to C3 having step structures, a channel layer penetrating the stack structure ST may be formed in a cell area in which memory cells are formed. After a through hole penetrating the stack structure ST is formed, the channel layer may be formed inside the through hole. The channel layer may be formed in a tube shape by forming a semiconductor layer along the surface of the through hole such that a central area of the through hole is opened. Alternatively, the channel layer may be formed by forming the semiconductor layer inside the through hole such that the central area of the through hole is filled with the semiconductor layer. Alternatively, the channel layer may include a tube-shaped partial area and the other area filled with the semiconductor layer up to the central area of the through hole. A central area of the tube-shaped channel layer may be filled with an insulating material. Before the channel layer is formed, a multi-layered insulating pattern may be further formed along the surface of the through hole.

Figure 3C:
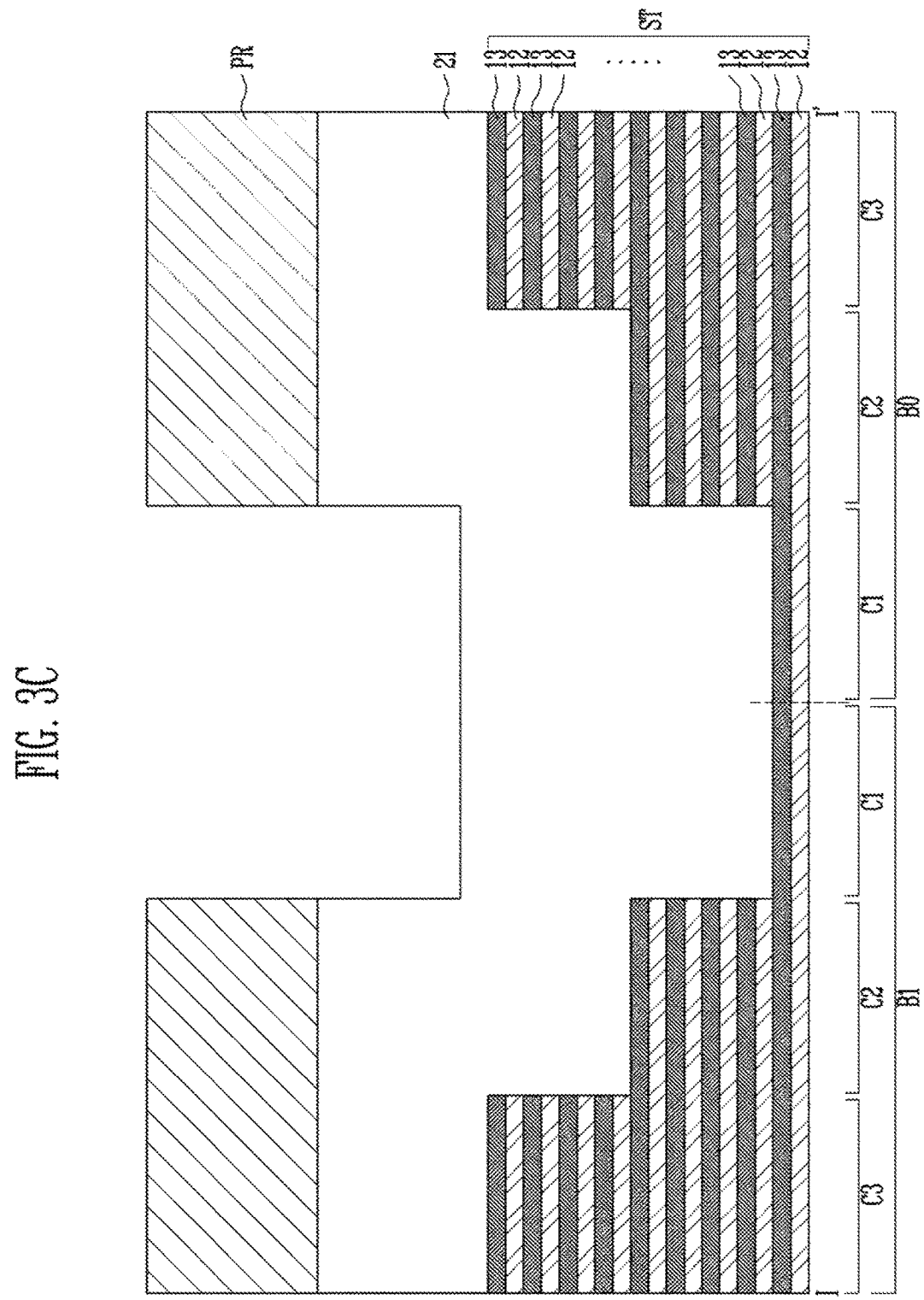

FIG. 3C is a sectional view taken along the first direction (I-I') shown in FIGS. 3A and 3B. In FIG. 3C, two memory blocks B0 and B1 are formed in a symmetrical manner to each other. However, embodiments are not limited thereto. For example, three or more memory blocks may be provided.

After the steps shown in FIG. 3B are performed, a first interlayer insulating layer 21 is formed over the entire structure. The first interlayer insulating layer 21 may be formed of an oxide. After that, sidewalls of the stack structure ST are exposed by performing a slit process in the cell area, and the exposed sacrificial layers are then selectively removed. Subsequently, spaces formed by removing the sacrificial layers are filled with conductive layers 13.

After that, a photoresist pattern PR is formed on the first interlayer insulating layer 21. The photoresist pattern PR is preferably formed such that the areas of the first connecting structures C1 of the first and second memory blocks B0 and B1, which are located opposite to each other, are opened. That is, the width of the opening formed by etching the photoresist pattern PR may correspond to the width of the first connecting structure C1.

After that, the first interlayer insulating layer 21 exposed using the photoresist pattern PR as an etch mask is etched to a predetermined thickness. In this case, the first interlayer insulating layer 21 is preferably etched in the vertical direction by performing an anisotropic etching process. Also, the first interlayer insulating layer 21 is preferably etched to such a thickness as the step difference between the first and second connecting structures C1 and C2.

Referring to FIG. 3D, sidewalls of the photoresist pattern PR are etched by a predetermined width. An isotropic etching process using an $O_2$ plasma process may be performed as the etching process. The width of the etched photoresist pattern PR may be equal to the width of the second connecting structure C2.

Referring to FIG. 3E, the first interlayer insulating layer 21 exposed using the photoresist pattern PR as an etch mask is etched to a predetermined thickness. In this case, the first interlayer insulating layer 21 is preferably etched in the vertical direction by performing an anisotropic etching process as the etching process. Also, the first interlayer insulating layer 21 is preferably etched to the step difference between the second and third connecting structures C2 and C3. Accordingly, the first interlayer insulating layer 21 is etched to have a step structure. Further, the first interlayer insulating layer 21 is patterned such that the stack thickness A1 of the first interlayer insulating layer 21 over the first connecting structure C1, the stack thickness A2 of the first interlayer insulating layer 21 over the second connecting structure C2, and the stack thickness A3 of the first interlayer insulating layer 21 over the third connecting structure C3 are equal to one another.

Referring to FIG. 3F, a plurality of contact holes 22H, 23H, and 24H are formed such that an upper conductive layer 13 of each of the plurality of connecting structures C1 to C3 is exposed after the photoresist pattern is removed. In the process of forming the plurality of contact holes 22H, 23H, and 24H, the stack thickness of the first interlayer insulating layer 21 over the first connecting structure C1, the stack thickness of the first interlayer insulating layer 21 over the second connecting structure C2, and the stack thickness of the first interlayer insulating layer 21 over the third connecting structure C3 are substantially equal to one another. Thus, it is possible to solve a problem that the conductive layer 13 under the contact hole is excessively etched or that the conductive layer 13 under the contact hole is not exposed.

After that, a plurality of lower contact plugs 22, 23, and 24 are formed by filling the plurality of contact holes 22H, 23H, and 24H with a conductive material. In this case, the lengths H1, H2, and H3 of the plurality of lower contact plugs 22, 23, and 24 are substantially equal to one another.

After that, lower contact pads 25, 26, and 27 are formed over upper end portion of the plurality of lower contact plugs 22, 23, and 24, respectively. A second interlayer insulating layer 31 is formed over the entire structure including the lower contact pads 25, 26, and 27. Subsequently, a plurality of contact holes are formed in the second interlayer insulating layer 31 and directly over the lower contact pads 25, 26, and 27, respectively. A plurality of upper contact plugs 32, 33, and 34 are then formed by filling the plurality of contact holes with a conductive material.

Although the thicknesses of the second interlayer insulating layer 31 over the first to third connecting structures C1 to C3 are different, when the contact holes are formed by etching the second interlayer insulating layer 31 it is possible to prevent the second interlayer insulating layer 31 from being excessively etched by using the lower contact pads 25, 26, and 27 as etch stop layers. The lengths of the plurality of upper contact plugs 32, 33, and 34 may be different from each other.

After that, upper contact pads 35, 36, and 37 are formed over upper end portions of the plurality of upper contact plugs 32, 33, and 34, respectively. In this case, the upper contact pads 35, 36, and 37 may be formed at the same height line, that is, at the same level.

Figure 4:
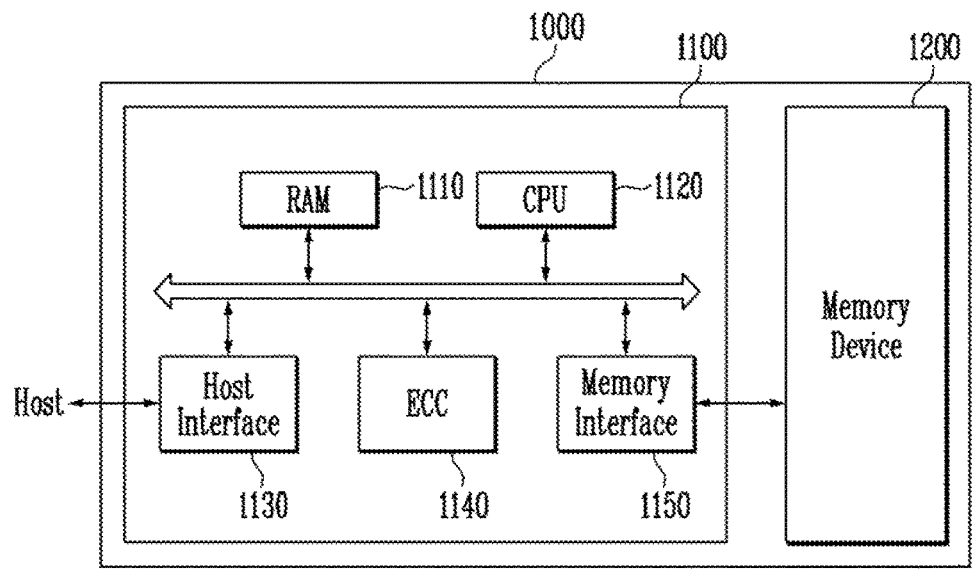
FIGS. 4 and 5 are block diagrams illustrating configurations of memory systems according to embodiments of the present invention.

FIG. 4 is a block diagram illustrating a configuration of a memory system according to an embodiment of the present invention.

As shown in FIG. 4, the memory system 1000 according to the embodiment of the present invention includes a memory device 1200 and a controller 1100.

The memory device 1200 is used to store data information having a variety of data forms, such as a text, a graphic, a software code, etc. The memory device 1200 may be a nonvolatile memory and may include the structure described with reference to FIGS. 1 and 2. The memory device 1200 is configured to include a stack structure including conductive layers stacked in a step shape; a first interlayer insulating layer formed over the stack structure, the first interlayer insulating layer including contact holes formed with a uniform depth to expose the conductive layers; lower contact plugs formed in the contact holes, the lower contact plugs being respectively contacted with the conductive layers; and contact pads respectively connected to the contact plugs, the contact pads being arranged in different heights. The structure and manufacturing method of the memory device 1200 are the same as described above, and therefore, detailed description thereof will be omitted.

The controller 1100 is connected to a host and the memory device 1200 and configured to access the memory device 1200 in response to a request from the host. For example, the controller 1100 is configured to control reading, writing, erasing, and background operations of the memory device 1200.

The controller 1100 includes a random access memory (RAM) 1110, a central processing unit (CPU) 1120, a host interface 1130, an error correction code (ECC) circuit 1140, a memory interface 1150, and the like.

Here, the RAM 1110 may be used as an operation memory of the CPU 1120, a cache memory between the memory device 1200 and the host, and a buffer memory between the memory device 1200 and the host. For reference, the RAM 1110 may be replaced with a static random access memory (SRAM), a read only memory (ROM), etc.

The CPU 1120 is configured to control overall operations of the controller 1100. For example, the CPU 1120 is configured to operate firmware such as a flash translation layer (FTL) stored in the RAM 1110.

The host interface 1130 is configured to interface with the host. For example, the controller 1100 communicates with the host using at least one of a variety of interface protocols such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 is configured to detect and correct an error included in data that is read from the memory device 1200, using an error correction code (ECC).

The memory interface 1150 may be configured to interface with the memory device 1200. For example, the memory interface 1150 includes an NAND interface or NOR interface.

For reference, the controller 1100 may further include a buffer memory (not shown) for temporarily storing data. Here, the buffer memory may be used to temporarily store data transferred to the outside through the host interface 1130 or data transferred from the memory device 1200 through the memory interface 1150. The controller 1100 may further include a ROM that stores code data for interfacing with the host.

As such, the memory system 1000 according to the embodiment of the present invention includes the memory device 1200 having an improved integration degree. Thus, the integration degree of the memory system 1000 can also be improved.

Figure 5:
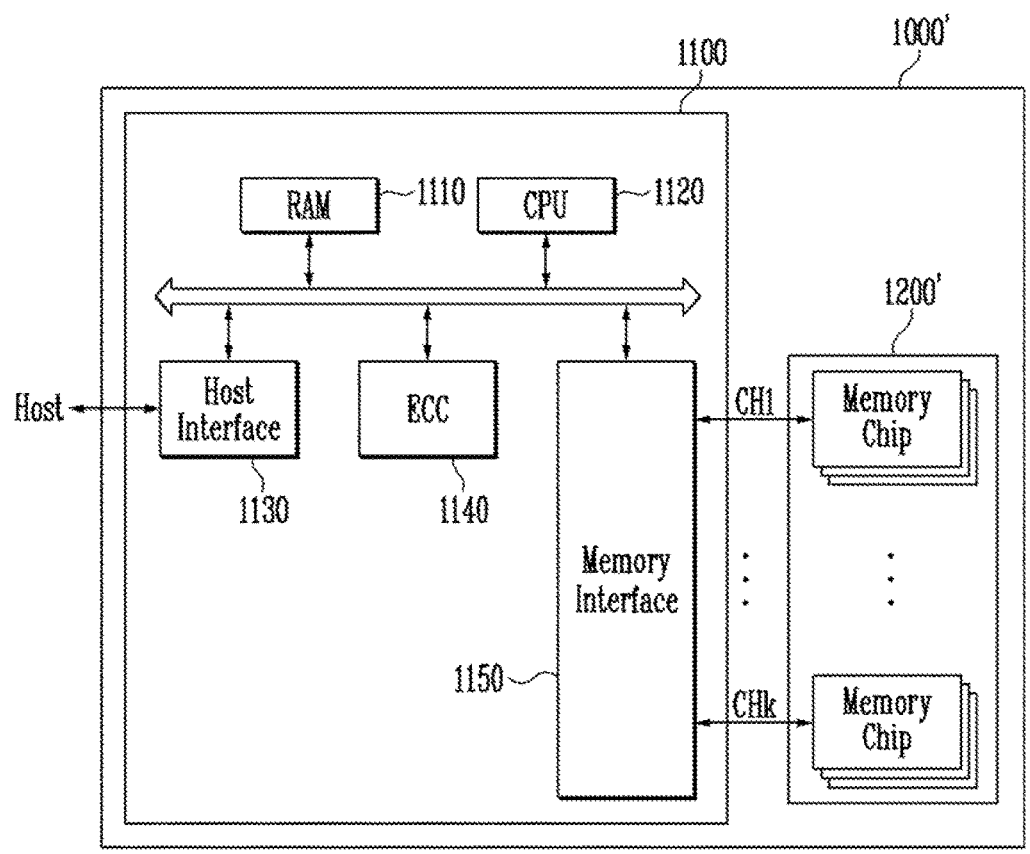

FIG. 5 is a block diagram illustrating a configuration of a memory system according to an embodiment of the present invention. Hereinafter, contents overlapping with those described above will be omitted.

As shown in FIG. 5, the memory system 1000' according to the embodiment of the present invention includes a RAM 1110, a CPU 1120, a host interface 1130, an ECC circuit 1140, a memory interface 1150, and the like.

The memory device 1200' may be a nonvolatile memory, and may include the structure described with reference to FIGS. 1 and 2. The memory device 1200' is configured to include a stack structure including conductive layers stacked in a step shape; a first interlayer insulating layer formed over the stack structure, the first interlayer insulating layer including contact holes formed with a uniform depth to expose the conductive layers; lower contact plugs formed in the contact holes, the lower contact plugs being respectively contacted with the conductive layers; and contact pads respectively connected to the contact plugs, the contact pads being arranged in different heights. The structure and manufacturing method of the memory device 1200' are the same as described above, and therefore, detailed description thereof will be omitted.

The memory device 1200' may be a multi-chip package including a plurality of memory chips. The plurality of memory chips are divided into a plurality of groups, which are configured to communicate with the controller 1100 over first to kth channels (CH1 to CHk), where, k is an integer. In addition, memory chips included in one group may be configured to communicate with the controller 1100 over a common channel. For reference, the memory system 1000' may be modified such that one memory chip is connected to one channel.

As such, the memory system 1000' according to the embodiment of the present invention includes the memory device 1200' having an improved integration degree. Thus, the integration degree of the memory system 1000' can also be improved. Particularly, the memory device 1200' is configured as a multi-chip package so that it is possible to increase the data storage capacity of the memory system 1000' and improve the driving speed of the memory system 1000'.

Figure 6:
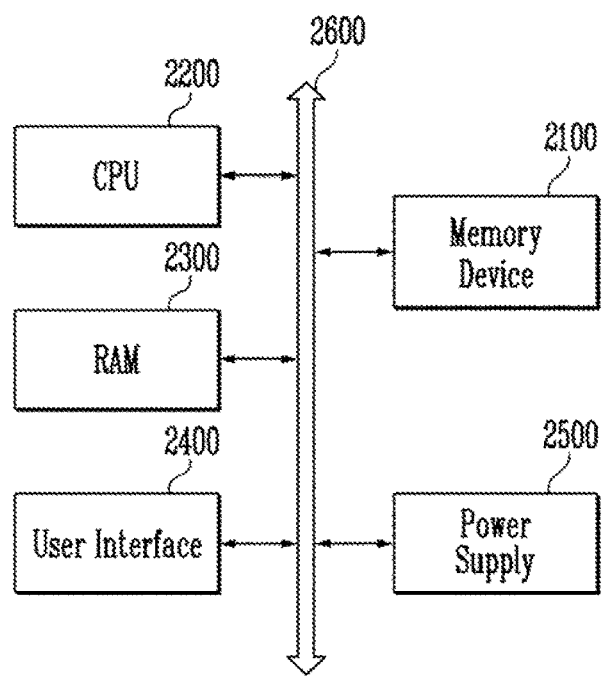
FIGS. 6 and 7 are block diagrams illustrating configurations of computing systems according to embodiments of the present invention.

FIG. 6 is a block diagram illustrating a configuration of a computing system according to an embodiment of the present invention. Hereinafter, descriptions which are the same as shown above will be omitted for conciseness.

As shown in FIG. 6, the computing system 2000 includes a memory device 2100, a CPU 2200, a RAM 2300, a user interface 2400, a power source 2500, a system bus 2600, and the like.

The memory device 2100 stores data provided through the user interface 2400, data processed by the CPU 2200, and the like. In addition, the memory device 2100 is electrically connected to the CPU 2200, the RAM 2300, the user interface 2400, the power source 2500, and the like through the system bus 2600. For example, the memory device 2100 may be connected to a controller (not shown) through the system bus 2600 or directly connected. When the memory device 2100 is directly connected to the system bus 2600, a function of the controller may be performed by the CPU 2200, the RAM 2300, etc.

The memory device 2100 may be a nonvolatile memory and may include the structure described with reference to FIGS. 1 and 2. The memory device 2100 is configured to include a stack structure including conductive layers stacked in a step shape; a first interlayer insulating layer formed over the stack structure, the first interlayer insulating layer including contact holes formed with a uniform depth to expose the conductive layers; lower contact plugs formed in the contact holes, the lower contact plugs being respectively contacted with the conductive layers; and contact pads respectively connected to the contact plugs, the contact pads being arranged at different heights. The structure and manufacturing method of the memory device 2100 are the same as described above, and therefore, detailed description thereof will be omitted.

The memory device 2100 may be a multi-chip package including a plurality of memory chips as described with reference to FIG. 5.

The computing system 2000 configured as described above may be a computer, a ultra mobile PC (UMPC), a workstation, a netbook, a personal digital assistant (PDA), a portable computer, a web tablet, a wireless phone, a mobile phone, a smartphone, an e-book, a portable multimedia player (PMP), a portable game console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of a variety of electronic devices constituting a home network, one of a variety of electronic devices constituting a computer network, one of a variety of electronic devices constituting a telematics network, an RFID device, etc.

As such, the computing system 2000 according to the embodiment of the present invention includes the memory device 2100 having an improved integration degree. Thus, the data storage capacity of the computing system 2000 can be improved.

Figure 7:
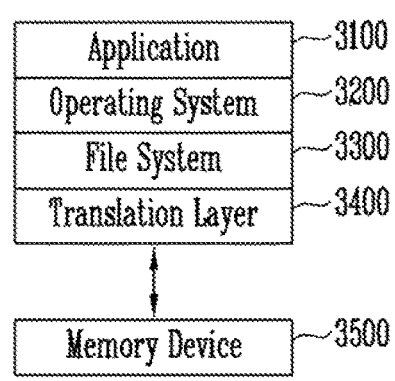

FIG. 7 is a block diagram illustrating a configuration of a computing system according to an embodiment of the present invention.

As shown in FIG. 7, the computing system 3000 according to the embodiment of the present invention includes a software layer including an operating system 3200, an application 3100, a file system 3300, a translation layer 3400, and the like. In addition, the computing system 3000 includes a hardware layer of a memory device 3500, etc.

The operating system 3200 may manage software resources, hardware resources, etc. of the computing system 3000, and control program execution of a central processing unit. The application 3100 is one of a variety of application programs running on the computing system 3000, and may be a utility executed by the operating system 3200.

The file system 3300 means a logical structure for managing data, files, etc. in the computing system 3000, and organizes the data or files stored in the memory device 3500 according to a rule. The file system 3300 may be determined depending on the operating system 3200 used in the computing system 3000. For example, when the operating system 3200 is one of Windows operating systems of Microsoft, the file system 3300 may be a file allocation table (FAT) or a NT file system (NTFS). When the operating system 3200 is one of Unix/Linux operating systems, the file system 3300 may be an extended file system (EXT), a Unix file system (UFS), or a journaling file system (JFS).

In this drawing, the operating system 3200, the application 3100, and the file system 3300 are shown as individual blocks. However, the application 3100 and the file system 3300 may be included in the operating system 3200.

The translation layer 3400 translates an address into a form suitable for the memory device 3500 in response to a request from the file system 3300. For example, the translation layer 3400 translates a logical address generated by the file system 3300 into a physical address of the memory device 3500. Mapping information between the logical address and the physical address may be stored as an address translation table. For example, the translation layer 3400 may be a flash translation layer (FTL), a universal flash storage link layer (ULL), etc.

The memory device 3500 may be a nonvolatile memory, and may include the structure described with reference to FIGS. 1 and 2. The memory device 3500 is configured to include a stack structure including conductive layers stacked in a step shape; a first interlayer insulating layer formed over the stack structure, the first interlayer insulating layer including contact holes formed with a uniform depth to expose the conductive layers; lower contact plugs formed in the contact holes, the lower contact plugs being respectively contacted with the conductive layers; and contact pads respectively connected to the contact plugs, the contact pads being arranged in different heights. The structure and manufacturing method of the memory device 3500 are the same as described above, and therefore, their detailed descriptions will be omitted.

The computing system 3000 configured as described above may be divided into an operating system layer performed in an upper level region and a controller layer performed in a lower level region. Here, the application 3100, the operating system 3200, and the file system 3300 are included in the operating system layer, and may be driven by the operation memory of the computing system 3000. In addition, the translation layer 3400 may be included in the operating system layer or the controller layer.

As such, the computing system 3000 according to the embodiment of the present invention includes the memory device having an improved integration degree. Thus, the data storage capacity of the computing system 3000 can be improved.

Example embodiments have been disclosed herein, and although specific terms are employed, they are used and are to be interpreted in a generic and descriptive sense only, and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
    a stack structure including conductive layers, wherein the conductive layer are stacked in a step shape;
    a first interlayer insulating layer formed over the stack structure, wherein the first interlayer insulating layer includes contact holes, wherein the contact holes have a uniform depth and expose the conductive layers;
    lower contact plugs formed in the contact holes, wherein the lower contact plugs are respectively in contact with the conductive layers; and lower contact pads respectively connected to the lower contact plugs,
wherein a width of each of the lower contact pads is greater than a width of each of the lower contact plugs, and the lower contact pads are arranged at different levels from each other.

2. The semiconductor device of claim 1, wherein the lower contact plugs have a uniform length.

3. The semiconductor device of claim 1, wherein the first interlayer insulating layer is formed in a step shape.

4. The semiconductor device of claim 1, wherein the stack structure includes:
a first stack structure including first to nth insulating layers and first to nth conductive layers, wherein each of the first to $n^{th}$ insulating layers and each of the first to $n^{th}$ conductive layers are alternately stacked, wherein the first stack structure has a step shape, wherein n is a natural number; and
a second stack structure including the first to the nth insulating layers and further including (n+1)th to 2nth insulating layers over the nth insulating layer, wherein the second stack structure includes the first to the $n^{th}$ conductive layers and further includes $(n+1)^{th}$ to $2n^{th}$ conductive layers over the $n^{th}$ conductive layer, wherein each of the first to $2n^{th}$ insulating layers and each of the first to $2n^{th}$ conductive layers are alternately stacked, wherein the second stack structure has a step structure.

5. The semiconductor device of claim 4,
wherein the lower contact pads are disposed over the first and the second stack structures,
wherein the lower contact pads disposed over the first stack structure are disposed at the same level, and
wherein the lower contact pads disposed over the second stack structure are disposed at the same level.

6. The semiconductor device of claim 4,
wherein lower contact plugs arranged in a first direction and connected to the first stack structure have a uniform length L1,
wherein the lower contact plugs arranged in the first direction connected to the second stack structure have the uniform length L1, and
wherein the first stack structure and the second stack structure are arranged in a second direction.

7. The semiconductor device of claim 1, further comprising:
a second interlayer insulating layer formed over the first interlayer insulating layer;
upper contact plugs respectively connected to the lower contact pads and penetrating the second interlayer insulating layer; and
upper contact pads respectively formed over the upper contact plugs.

8. The semiconductor device of claim 7, wherein the upper contact plugs have different lengths from each other.

9. The semiconductor device of claim 7, wherein the upper contact pads are arranged at the same level.

10. A semiconductor device comprising:
a stack structure including conductive layers, wherein the conductive layers are stacked in a step shape;
a first interlayer insulating layer formed over the stack structure, wherein the first interlayer insulating layer includes contact holes, wherein the contact holes have a uniform depth and respectively expose the conductive layers;
lower contact plugs respectively formed in the contact holes, wherein the lower contact plugs are respectively in contact with the conductive layers;
lower contact pads respectively connected to the contact plugs, wherein the lower contact pads are arranged at different levels from each other;
upper contact plugs respectively connected to the lower contact pads; and
upper contact pads respectively connected to the upper contact plugs, wherein the upper contact pads are arranged at the same level,
wherein a width of each of the lower contact pads is greater than a width of each of the lower contact plugs.

11. The semiconductor device of claim 10, wherein the lower contact plugs have a uniform length.

12. The semiconductor device of claim 10, wherein the first interlayer insulating layer is formed in a step shape.

13. The semiconductor device of claim 10, wherein the stack structure includes:
a first stack structure including first to nth insulating layers and first to nth conductive layers, wherein each of the first to nth insulating layers and each of the first to nth conductive layers are alternately stacked, wherein the first stack structure has a step shape, wherein n is a natural number; and
a second stack structure including the first to the nth insulating layers and further including (n+1)th to 2nth insulating layers over the nth insulating layer, wherein the second stack structure includes the first to the $n^{th}$ conductive layers and further includes $(n+1)^{th}$ to $2n^{th}$ conductive layers over the $n^{th}$ conductive layer, wherein each of the first to $2n^{th}$ insulating layers and each of the first to $2n^{th}$ conductive layers are alternately stacked, wherein the second stack structure has a step structure.

14. The semiconductor device of claim 13,
wherein the lower contact pads are disposed over the first and the second stack structures,
wherein the lower contact pads disposed over the first stack structure are located at the same level, and
wherein the lower contact pads disposed over the second stack structure are located at the same level.

15. The semiconductor device of claim 10, further comprising:
a second interlayer insulating layer formed over the first interlayer insulating layer,
wherein the second interlayer insulating layer are penetrated by the upper contact plugs.

16. A method of manufacturing a semiconductor device, the method comprising:
forming a stack structure including insulating layers and sacrificial layers and having a step shape, wherein the insulating layers and the sacrificial layer are alternately stacked;
forming a first interlayer insulating layer over the stack structure;
removing the sacrificial layers to create spaces;
forming conductive layers in the spaces formed by removing the sacrificial layers;
etching the first interlayer insulating layer such that the first interlayer insulating layer has a uniform thickness over the stack structure in the step shape;
forming first contact holes having a uniform depth and respectively exposing the conductive layers of the stack structure by etching the first interlayer insulating layer; and forming lower contact plugs by filling the contact holes with a conductive material, respectively.

17. The method of claim 16, further comprising:
forming lower contact pads over the lower contact plugs, respectively,
wherein the lower contact pads are formed at different levels from each other.

18. The method of claim 17, further comprising:
forming a second interlayer insulating layer over the first interlayer insulating layer;
forming second contact holes exposing the lower contact pads and penetrating the second interlayer insulating layer;
forming upper contact plugs by filling the second contact holes with a conductive material; and
forming upper contact pads over the upper contact plugs, respectively.

19. The method of claim 18, wherein the upper contact plugs have different lengths from each other, and
wherein the upper contact pads are formed at the same level.

* * * * *